United States Patent [19]
Bosman et al.

[11] Patent Number: 6,048,670
[45] Date of Patent: Apr. 11, 2000

[54] POWDER-BLASTING METHOD

[75] Inventors: Joseph C.M. Bosman; Harm Tolner; Henricus J. Ligthart; Franciscus C.M. De Haas, all of Eindhoven, Netherlands

[73] Assignee: U.S. Philips Corporation, New York, N.Y.

[21] Appl. No.: 08/968,375

[22] Filed: Nov. 12, 1997

[30] Foreign Application Priority Data

Nov. 22, 1996 [EP] European Pat. Off. .............. 96203287

[51] Int. Cl.[7] ...................................................... B24C 1/04
[52] U.S. Cl. ............................................. 430/323; 451/31
[58] Field of Search ............................... 430/323; 451/29, 451/30, 31; 219/131.41, 121.69, 121.71; 216/41, 67

[56] References Cited

U.S. PATENT DOCUMENTS

| | | | |
|---|---|---|---|
| 3,808,751 | 5/1974 | Usui | 51/312 |
| 4,858,394 | 8/1989 | Lalumiere et al. | 51/312 |
| 5,593,528 | 1/1997 | Dings et al. | 156/154 |
| 5,833,516 | 11/1998 | De Haas et al. | 451/29 |

FOREIGN PATENT DOCUMENTS

| | | |
|---|---|---|
| 2 257 935 | 1/1993 | United Kingdom . |
| WO95/13623 | 5/1995 | WIPO . |

*Primary Examiner*—John A. McPherson
*Attorney, Agent, or Firm*—F. Brice Faller

[57] ABSTRACT

Method of providing a pattern of apertures and/or cavities in a plate of material which is suitable for powder blasting, or of cutting pieces from a plate (2) of such a material by means of powder blasting, using a non-metal layer of blast-resistant material (3) as a mask which is patterned while or after it is fixedly provided on the surface of the plate.

2 Claims, 4 Drawing Sheets

POWDER-BLASTING METHOD

BACKGROUND OF THE INVENTION

The invention relates to a method of removing material from a part of a plate which is suitable for powder blasting by means of a powder-blasting technique, using a blasting mask.

Removing material may be understood to mean, for example, the provision of cavities and/or apertures, but also a process of cutting shapes (for example, discs) by way of powder blasting. The cavities may be, for example, slots, pits or grooves. Plates which are suitable for powder blasting are particularly made of hard, brittle materials such as glass or ceramic material (for example, ferrite, a sintered oxidic ferromagnetic material). The plates may be made of an insulating material (for example, glass), an electrically conducting material (for example, some types of ferrite) or a semiconducting material (for example, silicon and some types of ferrite). These types of plates are particularly used in flat lamps, meander lamps, TL lamps, luminescent gas discharge displays such as plasma displays, field emission displays, cathode ray tube displays and electron duct displays in which electrons are propagated in ducts having walls of insulating material in which the apertures and/or cavities are used for manipulating electron currents. They may be formed, for example, as control plates provided with addressable electrodes, as transport plates in which parallel cavities constitute ducts, and as spacer plates which may be placed, for example, between a control plate and a luminescent screen in a luminescent display.

A metal blasting mask is generally used in this method. The pattern to be blasted is defined in this blasting mask. Such a method is known from U.S. Pat. No. 5,593,528.

The use of a metal blasting mask has the drawback that it is expensive, while it can generally be used only once. Another drawback is the deformation of the metal due to the force of the abrasive powder particles. Consequently, the blasting mask may get detached during blasting, resulting in underblasting.

SUMMARY OF THE INVENTION

It is an object of the invention to provide a preferably low-cost method having a smaller risk of underblasting than the known method. To this end, a non-metal blasting mask is fixedly formed on the plate, whereafter the plate is provided with a pattern by means of powder blasting. The use of a non-metal mask material (preferably synthetic material) prevents the mask from being permanently deformed due to the mechanical forces of the abrasive powder particles and thus from being locally detached in such a way that underblasting occurs. By providing the mask directly on the plate and patterning it during or after its provision, it is achieved that the mask cannot be deformed before it is provided, so that there are no large tensions in the mask so that it is better held in position, thus inhibiting underblasting.

In accordance with an embodiment, for example, a blasting mask is provided on the plate by means of a printing method. This printing method may be silk screening. This embodiment has the advantage that no blast-resistant material is lost when manufacturing the blasting mask. Blast-resistant material is printed exactly at those locations where it is necessary.

In accordance with another embodiment, a blasting mask is formed by providing a layer of a blast-resistant material on the plate and by providing this plate with a desired pattern of apertures.

In a further embodiment, the blast-resistant material is a photosensitive material in which the desired pattern is provided by means of exposure and development.

The blast-resistant material of which the layer is manufactured may comprise, for example a polyurethane as a basic constituent. These materials have the advantage that they are elastic and consequently highly blast-resistant. Moreover, it is possible to give them photosensitive properties. To realize the photosensitivity, acrylic groups may be added to the polyurethane. The material is then referred to as polyurethane-acrylate. This embodiment has the advantage that the pattern in the blasting mask has a high accuracy due to the use of lithography (exposure).

A blast-resistant layer may be a coating obtained from a liquid substance which is provided on the plate. It has the advantage that it is inexpensive and also practical because the thickness of the blast-resistant layer can be varied, dependent on its use. However, the layer may alternatively be a solid coating which can be rolled out or a layer which is present in a laminate provided on the plate. A laminate has a layered structure. It usually consists of an undeveloped photosensitive layer having a given thickness, provided between two temporary cover foils (which are removed upon use). Extra layers may be provided to improve the adhesion.

A more specific embodiment of the method according to the invention comprises the steps of
  providing a photosensitive, blast-resistant layer;
  exposing the layer with the desired pattern;
  developing the layer;
  producing at least one jet of abrasive powder particles;
  directing the jet onto the surface of the mask formed by the patterned layer, which mask is present on the plate to be processed;
  performing a relative movement between the jet and the plate with the patterned mask, and
  removing the blast-resistant layer after the blasting process.

The way in which the layer is developed is dependent on the material used. This may be done, for example in soap water or in a basic liquid. The way in which the layer is removed after the blasting process is also dependent on the material used. There are materials in which the exposed parts are removable. Then, the layer can be removed by total exposure after the process. There are also materials in which the exposed parts are fixed and the unexposed parts are removable. Then, the layer can be removed, for example, by firing after the blasting process.

In accordance with another embodiment, the plate is provided with a blast-resistant resist for forming the blasting mask, in which a desired pattern is made by means of plasma etching, using a preformed etching mask (for example, of metal). This embodiment has the advantage that the resist does not need to be photosensitive and may thus be inexpensive.

In accordance with a further embodiment, the blast-resistant material is a resist, a resin or a film which film is patterned by means of a laser. The film is stuck onto the plate by means of an adhesive layer. This embodiment has the advantage that it is inexpensive because the blast-resistant material does not need to be photosensitive. The blast-resistant material may be patterned through a mask but it is alternatively possible to do this without a mask. In that case, the blast-resistant material is directly inscribed by means of the laser. This has a cost-saving advantage because an extra mask is not required.

As compared with, for example, chemical etching, the use of a powderblasting process for providing a plate with apertures and/or cavities has the advantage that a large number of parameters can be varied, inter alia, the type of abrasive powder, the grain size, the diameter of the nozzle blasting the powder particles, the distance between the nozzle and the plate, the pressure of the medium with which the powder particles are transported, the movement of the nozzle, and the speed of the relative movement between the nozzle and the plate. By varying these factors, it has been found possible to provide plates with a pattern of cavities and/or apertures meeting the requirements imposed on their use in displays. As compared with chemical etching, powder blasting has the advantage of being a more rapid, environmentally better and anisotropic process.

The invention may be particularly used to advantage for blasting cavities in the cell plate or channel plate of a plasma display (PDP). Since a blasting mask is used which is not made of metal, it is possible to blast "hard", without the risk of deformation of the blasting mask and underblasting. It is thus possible to blast directly in a (glass) plate. In the manufacture of PDPs, a (glass) frit layer was usually provided on the plate. The advantage of direct blasting in a glass plate is that the upper side of the partitions between the cells or channels is and remains flat. (In fact, it is a part of the surface of a (flat) plate.) This is necessary to be able to provide a cover plate in close relationship with the cell plate or channel plate. When using the invention, the upper side thus does not need to be flattened separately, so that a complicated process, as hitherto used in PDPs, in which, inter alia, the cells or ducts must be filled with wax, can be precluded.

The invention may be used to great advantage for manufacturing the channels in a channel plate for, for example an AC plasma display and a PALC (plasma-addressed liquid crystal) display. Since the blasting mask is formed by a layer which is patterned when it has already been provided on the plate, there is not a preformed mask having long unsupported wires which can easily move with respect to each other, as is the case with a metal mask. Thus, it is prevented that the blasting mask is already deformed before blasting takes place.

The invention may also be used to advantage when manufacturing channel plates for use in flat lamps, for example meander lamps. These lamps have a channel in which a gas discharge is ignited. The use of a mask according to the invention provides the possibility of manufacturing any desired configuration of the channels. It is, for example, very well possible to manufacture a spiral channel. If a metal mask were used, deformation problems would arise, just as with the channels of an AC plasma display.

The invention may further be used to advantage when pieces (for example, round discs) must be cut from a plate. When a premanufactured mask is used, this mask comprises a plurality of separate pieces which must first be, for example, punched, milled or sawn. These pieces are then laid on the substrate in a satisfactory distribution on the surface and stuck to the substrate. When an adhesive layer to be patterned is provided, any desired shape can be provided by means of, for example lithography. Positioning may be effected with precision and the pieces remain stuck due to the adhesive properties of the layer or due to an adhesive material which is provided between the layer and the substrate.

If a plate has to be processed on both sides, the two sides of the plate, which have first been provided with a photosensitive layer, are exposed simultaneously in an embodiment of the method according to the invention. The processing time will be shorter because the two sides of the plate are processed simultaneously. To provide the possibility for, for example, transparent plates to be processed at two sides simultaneously, a coating which is opaque to the light used is first applied on one side of the plate. When UV light is used for the exposure, a UV-blocking coating comprising, for example, $Fe(NO_3).9H_2O$ may be used. The coating may be formed by immersing the plate in a solution of $Fe(NO_3).9H_2O$.

DETAILED DESCRIPTION OF THE PREFERRED EMBODIMENTS

Figure 1:
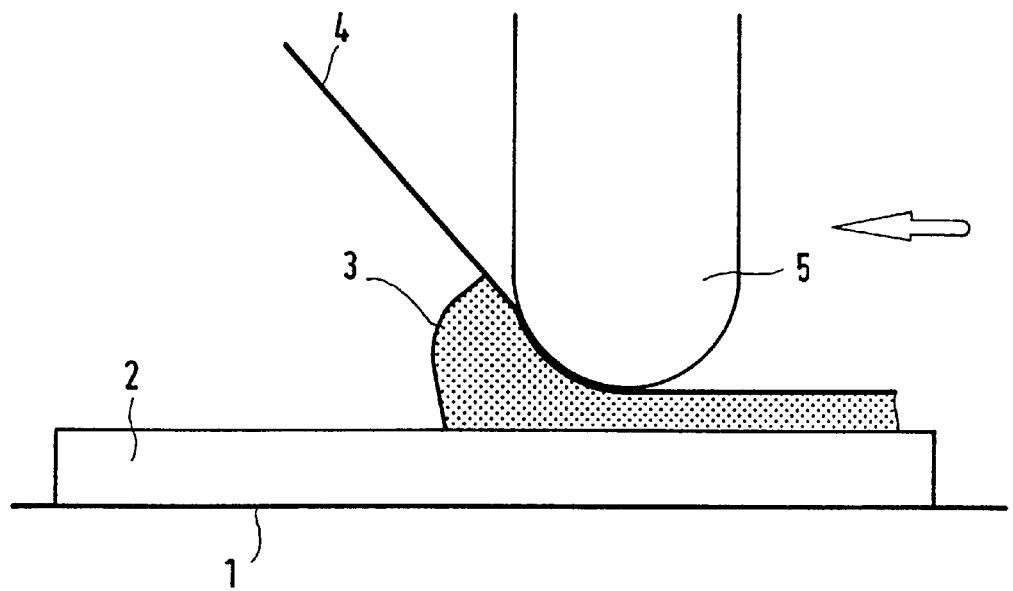
FIG. 1 shows an example of a method of providing a liquid coating on a plate.

FIG. 1 shows how a liquid coating material (3) can be provided on a plate (2). The liquid material preferably has a high viscosity. It may be increased by fixing the material, for example, by causing it to gel. In this example, a cover film (4) is provided simultaneously with the coating material (3) on the plate (2) by rolling it out with a doctor blade (5). In the Figure, the arrow shows the direction of movement of the doctor blade. When larger surfaces are used, it is difficult to work with a doctor blade. For large plates, a machine may be used, having an adjustable gutter for providing the liquid coating material. Subsequently, a roller may be used for providing the cover film and regulating the thickness of the coating. The cover film serves as an oxygen barrier during exposure. Such a barrier is required because oxygen functions as an inhibitor during polymerization. The cover film also serves as a protection of the mask which is placed on it, and lastly, it is used to achieve a homogeneous layer thickness. This is necessary for a satisfactory exposure and a uniform development. A larger layer thickness requires a longer development time of the material. The reference numeral (1) denotes a bottom film. A plate (2) of glass is used in the following example, but it may alternatively be made of a different (brittle) material which is suitable for powder blasting. The process may comprise the steps of

- pretreating the glass plate (2) so as to achieve a good adhesion. This may be realized by immersing it into a solution of 3-methacryloxypropyltrimethoxysilane;
- drying the glass plate (2), for example, at 60° C. for 5 minutes;
- positioning a bottom film (1) (for example, a 25 micrometer thick PET foil) which is slightly larger than the glass plate (2) on a flat base;
- placing the glass plate (2) on the bottom film (1);
- simultaneously providing the coating material (3) (photosensitive in this case) (of, for example a 100 micrometer thick polyurethane) and a cover film (4) (of, for example a 25 micrometer thick PET film) by means of a doctor blade. The angle of application should be chosen to be such that air bubbles do not occur underneath the layer;
- positioning a mask on the cover film (4) when patterning must take place;
- placing the assembly in an exposure machine;
- exposing the assembly;
- removing the assembly from the machine;
- removing the cover film (4). Frequently, portions of the unexposed parts of the coating material (3) are thereby also removed;
- the rest of the unexposed parts of the coating material (3) is removed by
  - passing the glass plate (1) provided with the coating material (3) across soft brushes in soap water, or brushing the plate with soft brushes;
  - spraying, by means of a high-pressure spray gun, soap water of, for example, 30° C. on the glass plate (2) provided with the coating material (3). (By means of this method, the unexposed parts of the coating material (3) are extra-satisfactorily removed and there is little damage.)
- exposing the glass plate (2) with the coating material (3) for a second time so as to cure, while excluding oxygen. (This exclusion of oxygen may be realized, for example, by immersing the plate in water.)
- drying the glass plate (2) with the coating material (3) at, for example 30° C., after curing;
- powder blasting the side of the glass plate (2) on which the coating material (3) is provided, and
- removing the coating material (3), after powder blasting, by placing the glass plate (2) with the coating material (3), for example, in a ventilated oven at 450° C. for 30 minutes.

Figure 2:
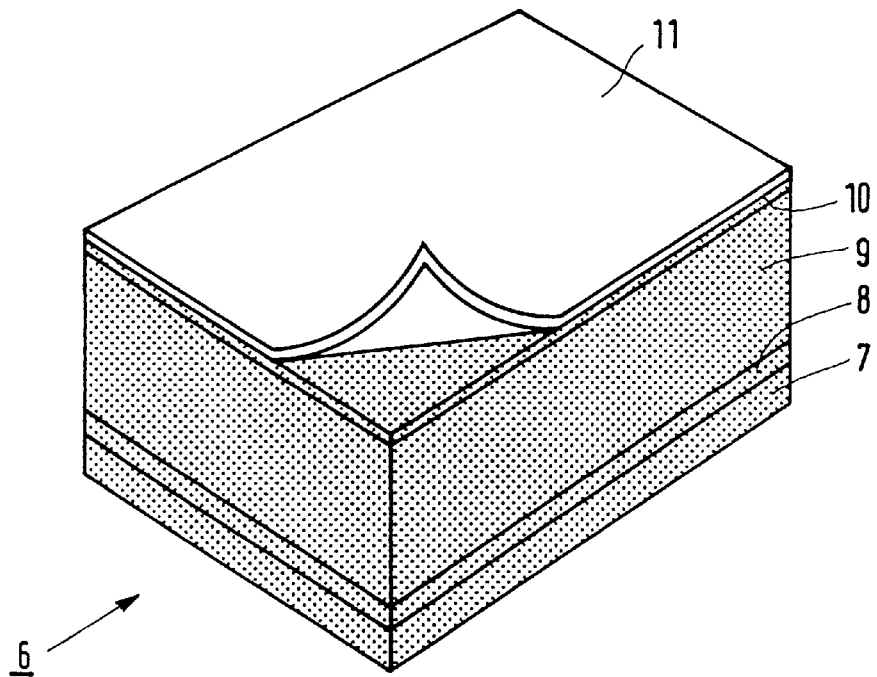
FIG. 2 is a cross-section of an example of a laminate.

FIG. 2 shows an example of the composition of a laminate (6). The laminate (6) shown comprises the following layers from bottom to top:

- a base (7) of polyester or steel;
- an adhesive and anti-halation layer (8);
- a photosensitive resin layer (9);
- a slip coat (10), and
- a cover film (11) of polyester.

The base (7), which is also referred to as the bottom film, may be, for example, a 100 micrometer thick PET film, and the cover film (11), also referred to as top film, may be a 40 micrometer thick PET foil. To provide a laminate (6) without air bubbles underneath, a soft rubber roller may be used. An embodiment of the method of removing material from a plate, using a laminate (6) for providing a mask comprises the steps of

- removing the base (7);
- rolling out the rest of the laminate (6) on a hot plate (of, for example 70° C.);
- removing the cover film while the plate is still hot;
- exposing the plate (for example, with UV) in the same way as for the liquid coating;
- removing the unexposed parts by spraying water (of, for example 30° C.) on it by means of a high-pressure spray gun. Sodium carbonate ($Na_2CO_3$) is dissolved in the water;
- immersing the plate in a bath containing acetic acid;
- rinsing the plate with water;
- patting the plate with a dry cloth;
- drying the plate (for example, at 50° C. for 30 minutes);
- powder blasting the side of the plate on which the mask is provided, and
- removing the rest of the mask by washing the plate in hot water (of, for example 40° C.).

Figure 3:
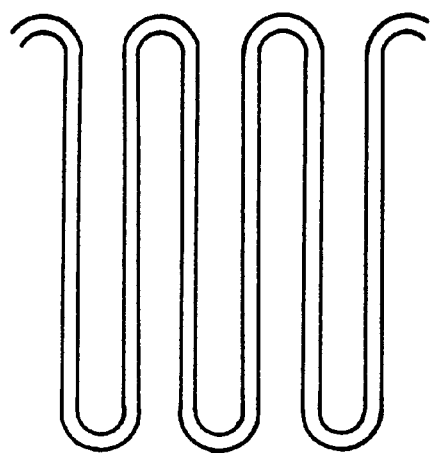
FIG. 3 shows diagrammatically a channel for a flat meander lamp.
Figure 4:
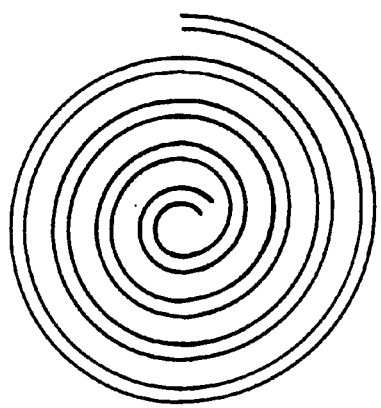
FIG. 4 shows diagrammatically a channel for a flat lamp having a spiral shape.
Figure 5:
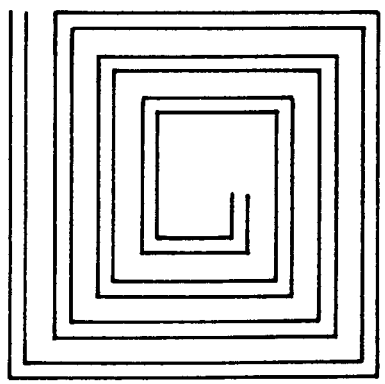
FIG. 5 shows diagrammatically a channel for a flat lamp having the shape of an angular spiral.

FIGS. 3, 4 and 5 show a number of possible channel shapes for a flat lamp. This may be, for example a TL lamp for a flat display such as an LCD. A flat lamp comprises two plates of, for example glass. Each of the two plates accommodates an open channel, such that the channels are mirror images of each other and communicate with each other when the plates are placed one on top of the other and thus constitute a closed channel. In another embodiment, one plate comprises an open channel and the other plate does not. The other plate then serves as a cover plate to close the channel. A metal mask for manufacturing the channel shapes shown would easily be deformed during blasting. Such a mask could easily get detached during manufacture of the spiral shapes. The use of a mask to be patterned on the plate avoids this problem. Moreover, the channels can be shaped more accurately because a lithography process is used. Since the channels can be shaped more accurately and since the mask is patterned on the substrate with a satisfactory adhesion, it is possible to apply a small pitch. This means that a large tube length can be obtained on a relatively small surface.

Figure 6:
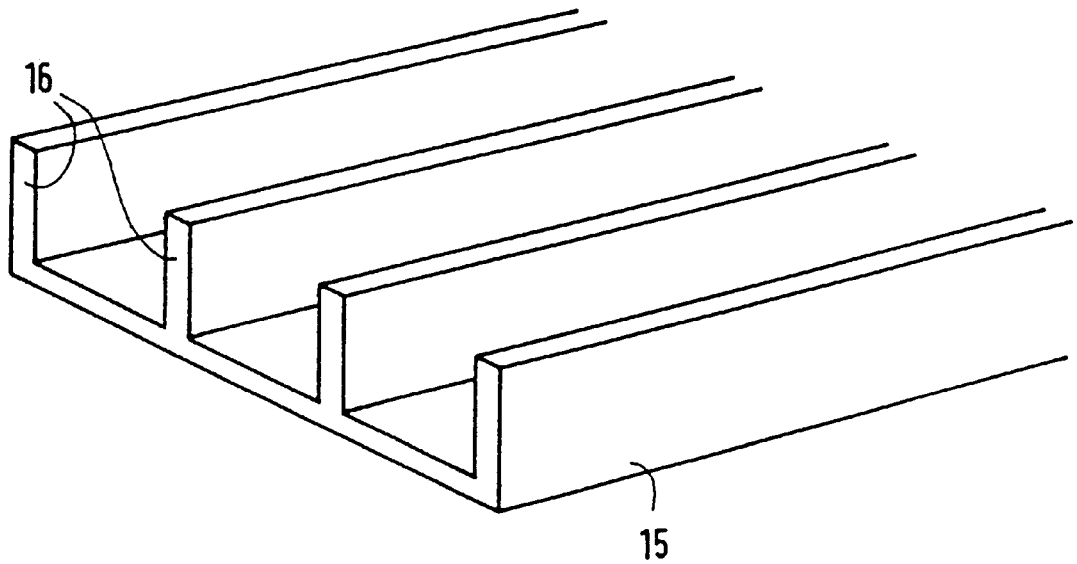
FIG. 6 is a diagrammatic spatial, elevational view of a channel plate for an AC plasma display or a PALC display.

FIG. 6 is a spatial, elevational view of a channel plate, for example an AC plasma display or a PALC display. The channel plate is formed from one piece, such that it comprises a bottom (15) and walls (16).

Figure 7:
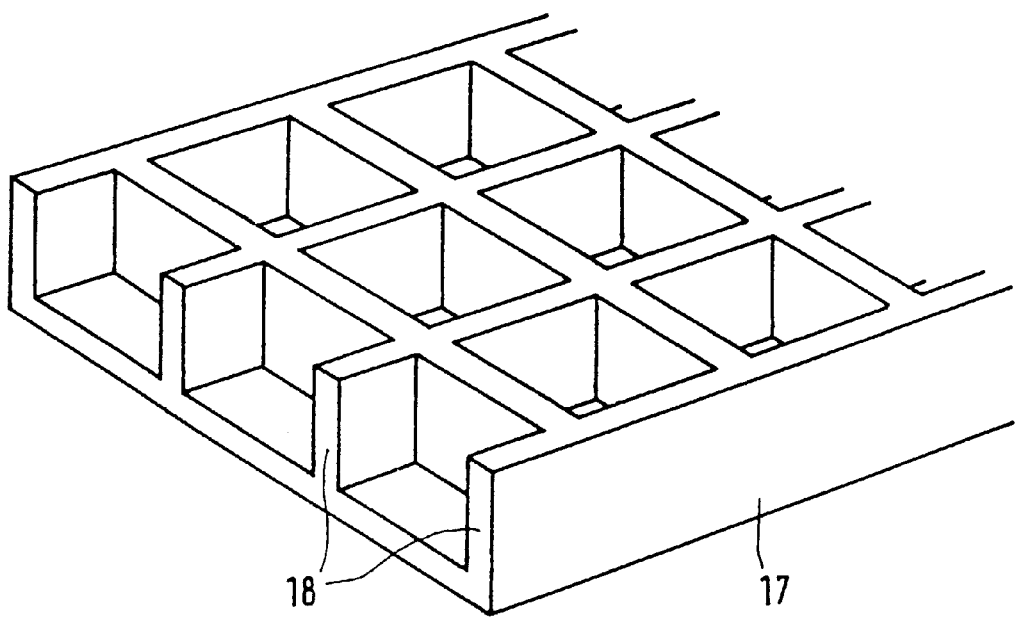
FIG. 7 is a diagrammatic spatial, elevational view of a cell plate for a DC plasma display.

FIG. 7 is a spatial, elevational view of a cell plate for, for example, a DC plasma display. The cell plate is formed from one piece, such that it comprises a bottom (17) and walls (18).

Figure 8:
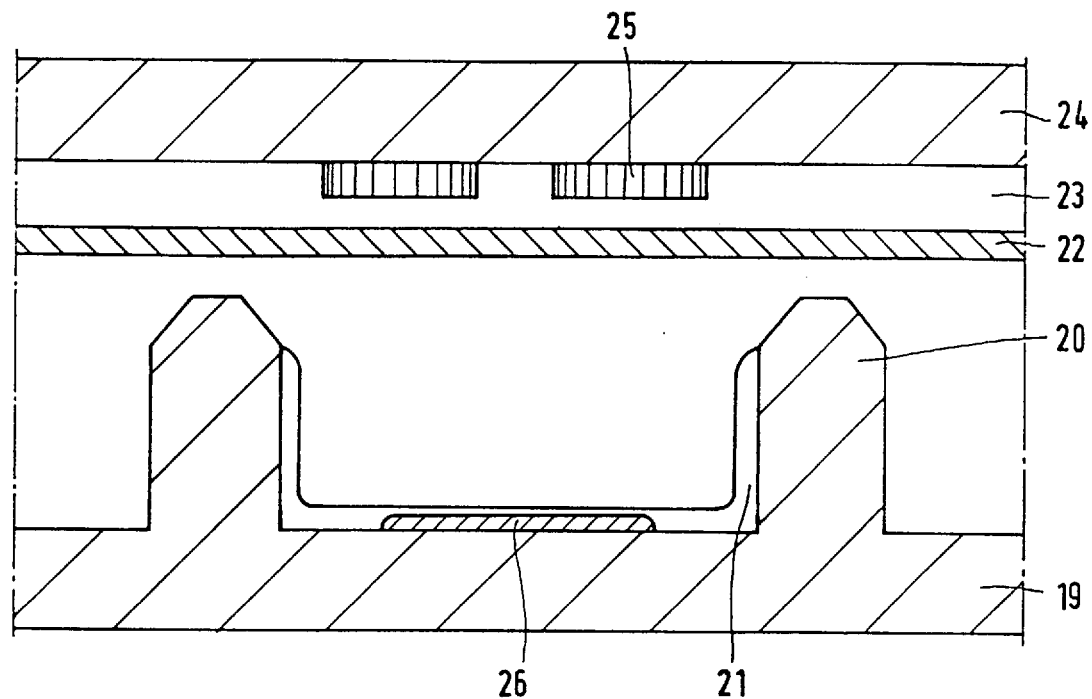
FIG. 8 is a diagrammatic cross-section of an example of a channel of an AC plasma display.

FIG. 8 is a cross-section of an example of an AC plasma display channel. Walls (20) are present on a bottom (19). Phosphorus (21) is provided between the walls (20). In this example, an MgO layer (22), a dielectric layer (23) and a front glass plate (24) are present above the walls (20). Display electrodes (25) made of a transparent material are present below the front glass plate (24). An addressing electrode (26) is present below the phosphorus. In this Figure, the cover plate is lifted from the channel plate.

Figure 9:
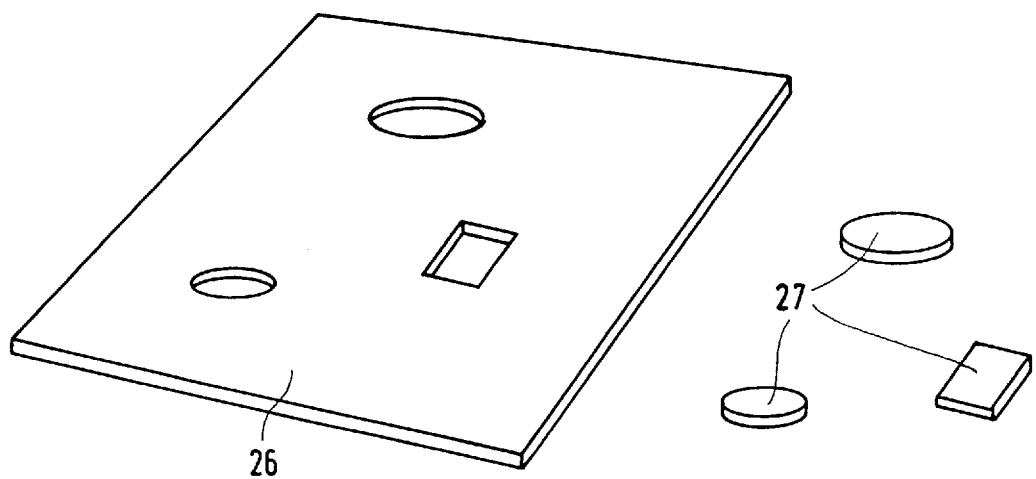
FIG. 9 shows diagrammatically a plate with pieces cut from this plate.

FIG. 9 shows diagrammatically a plate (26) and some pieces (27) removed from this plate. These pieces may be removed, for example, by providing a plate with a coating material and patterning this plate, for example, in such a way that it is open at the position of the outer edge of the desired pieces, whereafter the pieces are detached from the rest of the plate by means of powder blasting the plate with the patterned coating material.

In summary, the invention relates to a method of providing a pattern of apertures and/or cavities in a plate (2) of material which is suitable for powder blasting, or of cutting pieces from a plate of such a material by means of powder blasting, using a nonmetal layer of blast-resistant material (3) as a mask which is patterned while or after it is fixedly provided on the surface of the plate.

We claim:

1. A method of providing a pattern in a plate, the method comprising providing a plate which is susceptible to erosion, by powder blasting, providing a viscous, photosensitive blast-resistant coating material on the plate, rolling out the coating material to a desired thickness, providing a transparent cover film over the coating material while rolling out the coating material, selectively exposing the coating material to light thereby forming areas of exposed coating material and areas of unexposed coating material, removing the cover film, removing the unexposed coating material, curing the exposed coating material to form a blast-resistant mask fixed to the plate, and powder blasting the plate with said blast-resistant mask fixed to the plate, thereby forming a pattern where said plate is eroded away.

2. A method as in claim 1 wherein said pattern is a pattern of channels.

* * * * *